US008977805B2

(12) United States Patent
Maislos et al.

(10) Patent No.: US 8,977,805 B2
(45) Date of Patent: Mar. 10, 2015

(54) HOST-ASSISTED COMPACTION OF MEMORY BLOCKS

(75) Inventors: Ariel Maislos, Bnei Zion (IL); Barak Rotbard, Tel-Aviv (IL)

(73) Assignee: Apple Inc., Cupertino, CA (US)

( * ) Notice: Subject to any disclaimer, the term of this patent is extended or adjusted under 35 U.S.C. 154(b) by 120 days.

(21) Appl. No.: 13/593,237

(22) Filed: Aug. 23, 2012

(65) Prior Publication Data

US 2013/0007352 A1 Jan. 3, 2013

Related U.S. Application Data

(63) Continuation-in-part of application No. 12/728,287, filed on Mar. 22, 2010, now Pat. No. 8,832,354.

(60) Provisional application No. 61/534,389, filed on Sep. 14, 2011, provisional application No. 61/163,133, filed on Mar. 25, 2009.

(51) Int. Cl.
| | |
|---|---|
| G06F 12/00 | (2006.01) |
| G06F 12/02 | (2006.01) |
| G11C 16/10 | (2006.01) |
| G06F 3/06 | (2006.01) |
| G06F 11/10 | (2006.01) |

(52) U.S. Cl.
CPC ............ G06F 12/0246 (2013.01); G11C 16/10 (2013.01); *G06F 2212/1016* (2013.01); *G06F 2212/7205* (2013.01); G06F 3/0608 (2013.01); G06F 3/065 (2013.01); G06F 11/1008 (2013.01)
USPC ....................................................... 711/103

(58) Field of Classification Search
USPC ....................................................... 711/103
See application file for complete search history.

(56) References Cited

U.S. PATENT DOCUMENTS

| 5,802,069 | A  * | 9/1998  | Coulson ..................... 714/718 |
|---|---|---|---|
| 6,038,636 | A  * | 3/2000  | Brown et al. ................ 711/103 |
| 6,167,480 | A  * | 12/2000 | Williams et al. ............ 710/260 |
| 6,882,568 | B2 * | 4/2005  | Shiota et al. ............ 365/185.08 |
| 7,444,462 | B2   | 10/2008 | Traister |
| 7,739,472 | B2   | 6/2010  | Guterman |
| 7,890,550 | B2   | 2/2011  | Jung |
| 8,356,134 | B2   | 1/2013  | Ito |
| 8,533,384 | B2   | 9/2013  | Olbrich |
| 2006/0020751 | A1 * | 1/2006 | Ito et al. ..................... 711/113 |
| 2007/0130421 | A1 * | 6/2007 | Ahmad et al. ............... 711/112 |
| 2008/0082736 | A1 * | 4/2008 | Chow et al. ................. 711/103 |
| 2008/0086619 | A1 * | 4/2008 | Traister et al. ............... 711/170 |

(Continued)

OTHER PUBLICATIONS

International Search Report and Written Opinion from PCT/2013/056069, mailed Nov. 29, 2013, Apple Inc., pp. 1-9.

*Primary Examiner* — Charles Rones
*Assistant Examiner* — Nanci Wong
(74) *Attorney, Agent, or Firm* — Meyertons, Hood, Kivlin, Kowert & Goetzel, P.C.

(57) ABSTRACT

In a system that includes a host and a memory controller that is separate from the host and stores data for the host in a non-volatile memory, a method for data storage includes transferring from the memory controller to the host one or more source blocks from the non-volatile memory for compaction. The source blocks are compacted in the host by copying valid data from the source blocks into one or more destination blocks. The destination blocks are transferred from the host to the memory controller, and the destination blocks are stored by the memory controller in the non-volatile memory.

25 Claims, 3 Drawing Sheets

(56) References Cited

U.S. PATENT DOCUMENTS

| | | | |
|---|---|---|---|
| 2008/0126712 A1* | 5/2008 | Mizushima | 711/141 |
| 2008/0288712 A1* | 11/2008 | Cornwell et al. | 711/103 |
| 2009/0157949 A1* | 6/2009 | Leibowitz | 711/103 |
| 2009/0248964 A1 | 10/2009 | Yano et al. | |
| 2010/0082930 A1* | 4/2010 | Jiva et al. | 711/166 |
| 2011/0022789 A1* | 1/2011 | Fujimoto | 711/103 |

* cited by examiner

HOST-ASSISTED COMPACTION OF MEMORY BLOCKS

CROSS-REFERENCE TO RELATED APPLICATIONS

This application claims the benefit of U.S. Provisional Patent Application 61/534,389, filed Sep. 14, 2011. This application is a continuation-in-part of U.S. patent application Ser. No. 12/728,287, filed Mar. 22, 2010, now U.S. Pat. No. 8,832,354 which claims the benefit of U.S. Provisional Patent Application 61/163,133, filed Mar. 25, 2009. The disclosures of these related applications are incorporated herein by reference.

FIELD OF THE INVENTION

The present invention relates generally to data storage, and particularly to memory controllers that use host system resources.

BACKGROUND OF THE INVENTION

Several types of memory devices, such as Flash memories, use arrays of analog memory cells for storing data. Each analog memory cell stores a quantity of an analog value, also referred to as a storage value, such as an electrical charge or voltage. This analog value represents the information stored in the cell. In Flash memories, for example, each analog memory cell holds a certain amount of electrical charge. The range of possible analog values is typically divided into intervals, each interval corresponding to one or more data bit values. Data is written to an analog memory cell by writing a nominal analog value that corresponds to the desired bit or bits.

Some memory devices, commonly referred to as Single-Level Cell (SLC) devices, store a single bit of information in each memory cell, i.e., each memory cell can be programmed to assume two possible programming levels. Higher-density devices, often referred to as Multi-Level Cell (MLC) devices, store two or more bits per memory cell, i.e., can be programmed to assume more than two possible programming levels.

Flash memory devices are described, for example, by Bez et al., in "Introduction to Flash Memory," Proceedings of the IEEE, volume 91, number 4, April, 2003, pages 489-502, which is incorporated herein by reference. Multi-level Flash cells and devices are described, for example, by Eitan et al., in "Multilevel Flash Cells and their Trade-Offs," Proceedings of the 1996 IEEE International Electron Devices Meeting (IEDM), New York, N.Y., pages 169-172, which is incorporated herein by reference. The paper compares several kinds of multilevel Flash cells, such as common ground, DINOR, AND, NOR and NAND cells.

Eitan et al., describe another type of analog memory cell called Nitride Read Only Memory (NROM) in "Can NROM, a 2-bit, Trapping Storage NVM Cell, Give a Real Challenge to Floating Gate Cells?" Proceedings of the 1999 International Conference on Solid State Devices and Materials (SSDM), Tokyo, Japan, Sep. 21-24, 1999, pages 522-524, which is incorporated herein by reference. NROM cells are also described by Maayan et al., in "A 512 Mb NROM Flash Data Storage Memory with 8 MB/s Data Rate", Proceedings of the 2002 IEEE International Solid-State Circuits Conference (ISSCC 2002), San Francisco, Calif., Feb. 3-7, 2002, pages 100-101, which is incorporated herein by reference. Other exemplary types of analog memory cells are Floating Gate (FG) cells, Ferroelectric RAM (FRAM) cells, magnetic RAM (MRAM) cells, Charge Trap Flash (CTF) and phase change RAM (PRAM, also referred to as Phase Change Memory—PCM) cells. FRAM, MRAM and PRAM cells are described, for example, by Kim and Koh in "Future Memory Technology including Emerging New Memories," Proceedings of the $24^{th}$ International Conference on Microelectronics (MIEL), Nis, Serbia and Montenegro, May 16-19, 2004, volume 1, pages 377-384, which is incorporated herein by reference.

SUMMARY OF THE INVENTION

An embodiment of the present invention that is described herein provides a method for data storage in a system that includes a host and a memory controller that is separate from the host and stores data for the host in a non-volatile memory. The method includes transferring from the memory controller to the host one or more source blocks from the non-volatile memory for compaction. The source blocks are compacted in the host by copying valid data from the source blocks into one or more destination blocks. The destination blocks are transferred from the host to the memory controller, and the destination blocks are stored by the memory controller in the non-volatile memory.

In some embodiments, transferring the source blocks includes storing the source blocks in a Random Access Memory (RAM) of the host, and compacting the source blocks includes producing the destination blocks using a processor of the host and storing the destination blocks in the RAM. In an embodiment, copying the valid data includes performing a first sequence of read operations from the source blocks, and then performing a second sequence of write operations to the destination blocks.

In a disclosed embodiment, storing the destination blocks includes updating a logical-to-physical address mapping to indicate respective physical storage locations of the destination blocks in the non-volatile memory. In another embodiment, transferring the source blocks includes sending to the host indications that identify the valid data, and compacting the source blocks includes reading the valid data from the source blocks based on the indications. In an alternative embodiment, transferring the source blocks includes sending to the host only the valid data from the source blocks.

In another embodiment, transferring the source blocks and the destination blocks includes sending the source blocks and the destination blocks over a first physical interface that is separate from a second physical interface used for exchanging memory access commands between the memory controller and the host. In yet another embodiment, transferring the source blocks and the destination blocks includes sending the source blocks and fetching the destination blocks by the memory controller without execution of any operations by the host relating to transfer of the source blocks and the destination blocks.

In some embodiments, transferring the source blocks and the destination blocks includes sending the source blocks and the destination blocks over a common physical interface that is also used for exchanging memory access commands between the memory controller and the host. The common physical interface may conform to a NAND interface specification, a Micro-SD (μSD) interface specification, an Embedded Multi-Media Card (eMMC) interface specification, a Universal Flash Storage (UFS) interface specification, a Serial Advanced Technology Attachment (SATA) interface specification, a Universal Serial Bus (USB) interface specification or a Peripheral Component Interconnect (PCI) interface.

In an embodiment, transferring the source blocks and the destination blocks includes: using a hardware signal, sending a request from the memory controller to the host to exchange information with the memory controller; and, responsively to the request, initiating exchange of at least one source block or at least one destination block by the host. In another embodiment, transferring the source blocks includes sending the source blocks in responses sent from the memory controller to the host, and transferring the destination blocks includes sending the destination blocks in one or more host commands sent from the host to the memory controller.

There is additionally provided, in accordance with an embodiment of the present invention, a data storage apparatus including a first interface, a second interface and a processor. The first interface is configured to communicate with a non-volatile memory. The second interface is configured to communicate with a host. The processor is configured to transfer to the host one or more source blocks from the non-volatile memory for compaction, to receive from the host one or more destination blocks that were produced in the host by copying valid data from the source blocks into the destination blocks, and to store the destination blocks in the non-volatile memory.

There is also provided, in accordance with an embodiment of the present invention, a data storage apparatus including a non-volatile memory, a host and a memory controller. The non-volatile memory includes multiple memory blocks. The host is configured to receive for compaction one or more source blocks of the non-volatile memory, and to compact the source blocks by copying valid data from the source blocks into one or more destination blocks. The memory controller is configured to select the source blocks for compaction, to transfer the source blocks to the host, to receive the destination blocks from the host and to store the destination blocks in the non-volatile memory.

The present invention will be more fully understood from the following detailed description of the embodiments thereof, taken together with the drawings in which:

DETAILED DESCRIPTION OF EMBODIMENTS

Overview

In some data storage applications, a memory controller is connected to a host system and stores data for the host system in a non-volatile memory. For example, a mobile phone or media player may store data in a Micro-Secure Digital (μSD) card, Embedded Multi-Media Card (eMMC) or Universal Flash Storage (UFS) device. A personal computer may store data in a Solid State Drive (SSD). In many cases, the host system has more hardware resources (e.g., memory space and computational power) than the internal resources of the memory controller.

Embodiments of the present invention that are described hereinbelow provide improved methods and systems for data storage. In these methods and systems, the memory controller uses resources of the host system in order to improve storage performance.

In some embodiments, a memory controller stores data for a host in a non-volatile memory, such as Flash memory. In addition, the memory controller carries out various memory management tasks, including compaction of memory blocks of the non-volatile memory. The compaction process is also referred to as "garbage collection." Compaction typically involves selecting one or more source blocks that comprise both valid data and invalid data, and copying only the valid data from the source blocks into one or more destination blocks in a compact manner. The source blocks are then available for erasure and reuse.

In some disclosed embodiments, the memory controller selects the source blocks for compaction, and later stores the compacted destination blocks in the non-volatile memory, but the actual compaction process (i.e., copying of valid data from the source blocks to the destination blocks) is performed by the host. For this purpose, the memory controller and the host transfer source and destination blocks between them.

Since the host typically has larger memory space and higher computational power than the memory controller, delegating the compaction process to the host improves the compaction performance considerably. In particular, the large memory space enables the host to copy the valid data by performing long sequences of read operations followed by long sequences of write operations. This sort of sequential operation improves the efficiency of the compaction process significantly.

Moreover, the large memory space enables the host to process a large number of source and destination blocks simultaneously, and thus optimize compaction performance. The high computational power of the host reduces the latency of the compaction process. Furthermore, delegating intensive management tasks to the host enables reduction of the cost, size and power consumption of the memory controller. As another benefit, since the host performs the compaction process, it may remap the logical addresses when sending the compacted blocks back to the memory controller.

System Description

Figure 1:
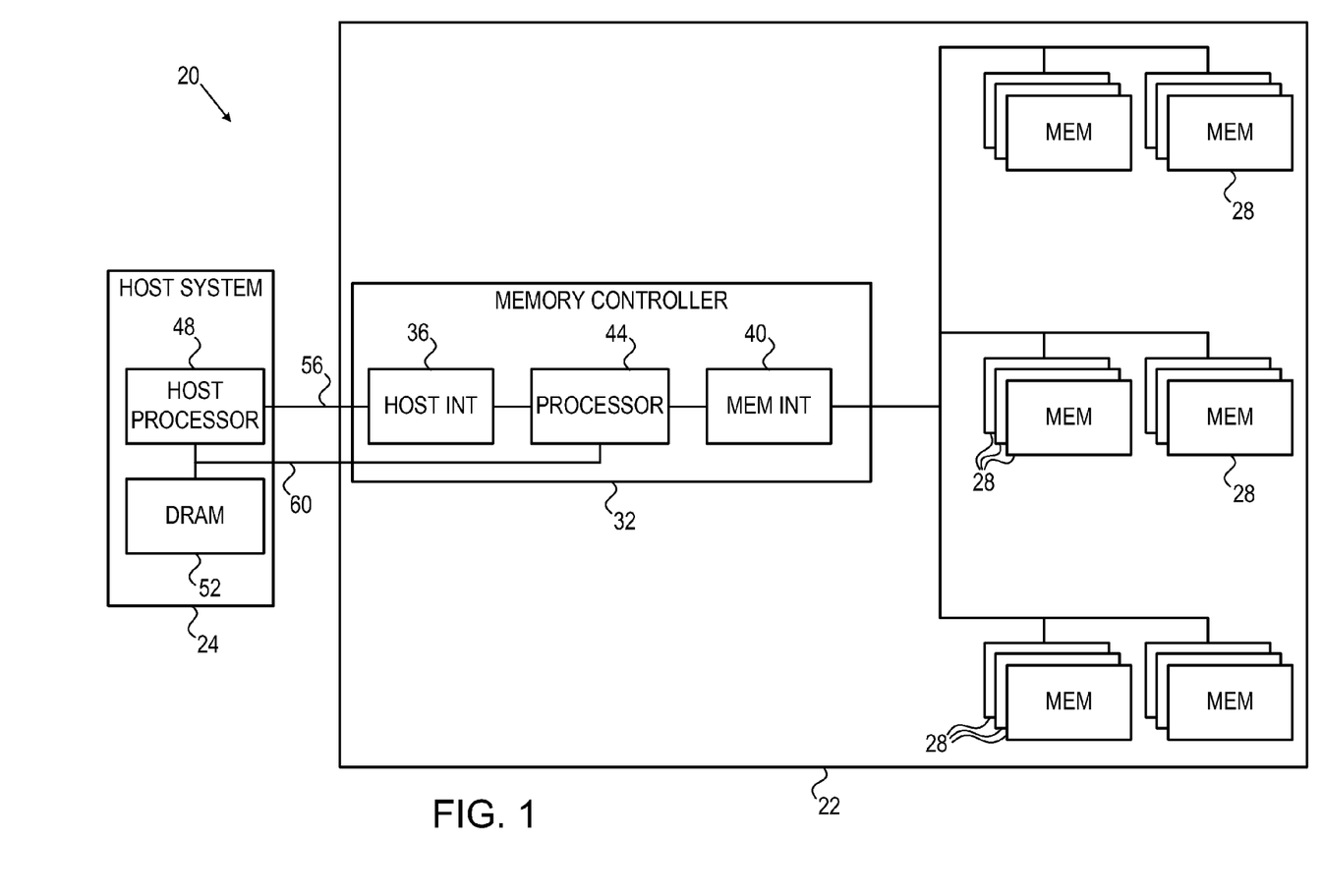
FIG. 1 is a block diagram that schematically illustrates a data storage system, in accordance with an embodiment of the present invention.

FIG. 1 is a block diagram that schematically illustrates a data storage system 20, in accordance with an embodiment of the present invention. System 20 comprises a memory system 22 and a host system 24. Memory system 22 accepts data for storage from host system 24 and stores it in memory, and retrieves data from memory and provides it to the host system. In the present example, system 22 comprises a Micro-Secure Digital (μSD) card that stores data for a cellular phone, media player, digital camera or other host. In alternative embodiments, however, system 22 may be used in any other suitable application and with any other suitable host system, such as in computing devices such as mobile computers that store data in SSD, in WiFi terminals or other communication terminals, Global Positioning System (GPS) units, removable memory modules such as Disk-On-Key (DOK) devices, Secure Digital (SD) cards, Multi-Media Cards (MMC) and embedded MMC (eMMC), digital cameras, music and other media players such as Portable Media Players (PMP), and/or any other system or device in which data is stored and retrieved.

Memory system 22 comprises multiple memory devices 28, each comprising multiple analog memory cells. In the present example, devices 28 comprise non-volatile NAND Flash devices, although any other suitable memory type, such as NOR and Charge Trap Flash (CTF) Flash cells, phase change RAM (PRAM, also referred to as Phase Change Memory—PCM), Nitride Read Only Memory (NROM), Ferroelectric RAM (FRAM) and/or magnetic RAM (MRAM) can also be used.

In the context of the present patent application and in the claims, the term "analog memory cell" is used to describe any memory cell that holds a continuous, analog value of a physical parameter, such as an electrical voltage or charge. Any suitable type of analog memory cells, such as the types listed above, can be used. In the present example, each memory device 28 comprises a non-volatile memory of NAND Flash cells. The charge levels stored in the cells and/or the analog voltages or currents written into and read out of the cells are referred to herein collectively as analog values or storage values. Although the embodiments described herein mainly address threshold voltages, the methods and systems described herein may be used with any other suitable kind of storage values.

System 22 stores data in the analog memory cells by programming the cells to assume respective memory states, which are also referred to as programming levels. The programming levels are selected from a finite set of possible levels, and each level corresponds to a certain nominal storage value. For example, a 2 bit/cell MLC can be programmed to assume one of four possible programming levels by writing one of four possible nominal storage values into the cell. The memory cells are typically arranged in rows and columns. Typically, a given memory device comprises multiple erasure blocks (also referred to as memory blocks), i.e., groups of memory cells that are erased together.

Each memory device 28 may comprise a packaged device or an unpackaged semiconductor chip or die. Generally, memory system 22 may comprise any suitable number of memory devices of any desired type and size. Although the system configuration of FIG. 1 comprises multiple memory devices, some of the methods and systems described herein can also be used in systems having only a single memory device.

Memory system 22 comprises a memory controller 32, which accepts data from host system 24 and stores it in memory devices 28, and retrieves data from the memory devices and provides it to the host system. Memory controller 32 comprises a host interface 36 for communicating with host system 24, a memory interface 40 for communicating with memory devices 28, and a processor that processes the stored and retrieved data. For example, processor 44 may encode the data for storage with an Error Correction Code (ECC) and decode the ECC of data read from memory. The functions of processor 44 can be implemented, for example, using software running on a suitable Central Processing Unit (CPU), using hardware (e.g., state machine or other logic), or using a combination of software and hardware elements.

In some embodiments, memory controller 32 uses hardware resources of host system 24 for performing memory access operations (e.g., read or write operations) that access memory devices 28. In the embodiment of FIG. 1, host system 24 comprises a host processor 48 and a host memory, in the present example comprising a Dynamic Random Access Memory (DRAM) 52. DRAM 52 may be used by host processor 48 for storing data, for storing program instructions or for any other purpose. In some embodiments, some of the storage space in DRAM 52 is used for storing information used by memory controller 32. In the example of FIG. 1, memory controller 32 communicates with host processor 48 (via host interface 36) using a host bus 56. In addition, processor 44 of memory controller 32 communicates directly with DRAM 52 using a dedicated interface 60. In alternative embodiments, memory controller 32 communicates with host processor 48 and with DRAM 52 using host bus 56, in which case interface 60 is omitted.

Memory controller 32, and in particular processor 44, may be implemented in hardware. Alternatively, the memory controller may comprise a microprocessor that runs suitable software, or a combination of hardware and software elements. In some embodiments, processor 44 comprises a general-purpose processor, which is programmed in software to carry out the functions described herein. The software may be downloaded to the processor in electronic form, over a network, for example, or it may, alternatively or additionally, be provided and/or stored on tangible media, such as magnetic, optical, or electronic memory.

The system configuration of FIG. 1 is an example configuration, which is shown purely for the sake of conceptual clarity. Any other suitable memory system configuration can also be used. For example, in some embodiments two or more memory controllers 32 may be connected to the same host processor. Although the embodiments described herein refer to DRAM, host system may comprise any other suitable type of volatile and/or non-volatile host memory. Elements that are not necessary for understanding the principles of the present invention, such as various interfaces, addressing circuits, timing and sequencing circuits and debugging circuits, have been omitted from the figure for clarity.

In the exemplary system configuration shown in FIG. 1, memory devices 28 and memory controller 32 are implemented as separate Integrated Circuits (ICs). In alternative embodiments, however, the memory devices and the memory controller may be integrated on separate semiconductor dies in a single Multi-Chip Package (MCP) or System on Chip (SoC), and may be interconnected by an internal bus. Further alternatively, some or all of the memory controller circuitry may reside on the same die on which one or more of the memory devices are disposed. Further alternatively, some or all of the functionality of memory controller 32 can be implemented in software and carried out by host processor 48 or other element of host system 24, or by any other type of memory controller. In some embodiments, host processor 48 and Memory controller 32 may be fabricated on the same die, or on separate dies in the same device package.

Data Storage in Non-Volatile Memory Using Host System Resources

In many practical applications, host system 24 has considerably more hardware resources than those available internally in memory controller 32. In some mobile phones, for example, memory controller 32 comprises a SD or eMMC controller having limited memory resources and limited computational power. The host system, on the other hand, often comprises a powerful processor and considerable DRAM storage space. In some embodiments of the present invention, memory controller 32 uses the richer hardware resources of host system 24 for accessing memory devices 28. In the example of FIG. 1 the hardware resource comprises host memory (DRAM) storage space, although various other hardware resources of the host system can also be used.

In some embodiments, storage space is assigned in DRAM 52 for storing information items that are used by memory controller 32 in accessing memory devices 28. In addition, the memory controller supports one or more operations that access memory devices 28 using the information items stored in the DRAM. The information items may comprise, for example, storage parameters and configurations, logical-to-physical address translation tables or any other information that is useful for the memory controller in accessing (e.g., reading, writing or erasing) the memory devices. When executing a given operation of this sort, usually in response to a host command, the memory controller retrieves the appropriate information from DRAM 52 and then accesses memory devices 28 using the retrieved information.

In some embodiments, the information items stored in DRAM 52 comprise storage parameters for respective groups of memory cells. Information items may be stored per memory device, per memory die, per erasure block, per word line or page, or per any other suitable group of memory cells. When preparing to access (e.g., read, write or erase) a given group of memory cells in devices 28, the memory controller retrieves the storage parameters of this memory cell group from DRAM 52, and then accesses the memory cells in the group using the retrieved storage parameters. Since the available storage space in DRAM 52 is often considerably larger than the internal storage space in processor 44, this technique enables the memory controller to better match the storage parameters to the actual group of memory cells being accessed. Any suitable storage parameters can be used.

For example, memory devices 28 may comprise analog memory cells (e.g., Flash cells) that are read by comparing their storage values to certain read thresholds. In these embodiments, memory controller 32 may store read threshold values for different groups of memory cells (e.g., for different erasure blocks) in DRAM 52. The memory controller supports a read operation, which reads data from a certain group of memory cells in devices 28 by retrieving the read threshold values applicable to this group from DRAM 52, and then reading the data from the group using the retrieved read thresholds.

As another example, the memory cells in memory devices 28 may be programmed using an iterative Programming and Verification (P&V) process. In a typical P&V process, an entire memory page is written by applying a sequence of programming pulses to a group of memory cells that are mapped to this page. The level of the programming pulses increases incrementally from pulse to pulse. The storage values programmed in the cells are read ("verified") after each pulse, and the iterations continue until the desired levels are reached. In some embodiments, parameters of the P&V process that are applicable to different groups of memory cells are stored in DRAM 52 of host system 24. The memory controller supports a write operation, which stores data in a certain group of memory cells by retrieving the corresponding P&V parameters from DRAM 52, and then programming the group of memory cells using the retrieved P&V parameters.

P&V parameters that may be stored in DRAM 52 may comprise, for example, verification thresholds that are used for verifying the storage values written into the memory cells, incremental step sizes (i.e., the increment between successive programming pulses, also referred to as Incremental Step Pulse Programming—ISPP), initial programming pulse magnitudes, and/or any other suitable parameter.

As yet another example, the memory cells in devices 28 may be erased and then verified against certain erase verification thresholds. In some embodiments, the memory controller stores different erase verification threshold values for different memory cell groups in DRAM 52. The memory controller may support an erase operation, which retrieves the erase verification threshold values of this cell group from DRAM 52 and erases the cell group using the retrieved thresholds.

Other examples of information items that can be stored in DRAM 52 are indicative of the wear level or health level of respective groups of memory cells in devices 28, or other historic figures-of-merit of the memory cells. Such information items may comprise, for example, the number of Programming and Erasure (P/E) cycles that each group of memory cells has gone through, or the time that elapsed since the last programming of each group of memory cells.

Other information items may be indicative of the level of distortion present in each group of memory cells in devices 28. Such parameters may comprise, for example, an estimate of cross-coupling interference, an estimated drift of the cells' storage values, or an estimated temperature-time integral (the operating temperature integrated over time) for different groups of memory cells. Yet another example of an information item that can be stored in DRAM 52 comprises the index of the last page that was stored in each erasure block. All of these information items may be useful in determining the way the memory cells are read and/or programmed. Example techniques of this sort are described, for example, in PCT International Publications WO 2007/132453, WO 2007/132457, WO 2008/026203, WO 2008/053472 and WO 2008/111058, whose disclosures are incorporated herein by reference.

In some embodiments, memory controller 32 stores data in different groups of memory cells in devices 28 using different storage configurations. For example, the memory controller may modify the number of programming states (programming levels) and/or the Error Correction Code (ECC) from one memory cell group to another. Example techniques of this sort are described, for example, in PCT International Publication WO 2007/132456, whose disclosure is incorporated herein by reference. As another example, the memory controller may use different ECC block sizes, e.g., in order to provide different trade-offs between error correction capability and latency. In an example embodiment, the memory controller may encode some pages using 2 KB blocks, and other pages using 4 KB blocks.

In some embodiments, memory controller 32 stores in DRAM 52 the storage configurations to be applied in different memory cells groups of devices 28 (e.g., the number of programming levels, the type of ECC and/or the ECC block size to be used in each erasure block, word line or page). The memory controller supports read and write operations that retrieve the storage configuration for a given memory cell group from DRAM 52, and then read or program the cell group using the retrieved storage configuration.

In some embodiments, the memory controller receives from host system 24 read/write commands that are specified using logical addresses (also referred to as virtual addresses). The memory controller translates the logical addresses into physical storage locations in memory devices 28, and reads or writes the data to or from the appropriate physical storage locations. Translation between logical addresses and physical storage locations is typically performed by querying translation tables that are managed by the memory controller.

In some embodiments, memory controller 32 stores the mapping between logical addresses and physical storage locations in DRAM 52. The logical-physical mapping may be represented by one or more tables, or using any other suitable data structure. The mapping may map logical addresses to physical storage locations, physical storage locations to logical addresses, or both. In these embodiments, the memory controller supports read and write operations that translate between logical addresses and physical storage locations by querying the mapping stored in DRAM 52.

For example, in response to a read command from the host system that requests readout from a given range of logical addresses, the memory controller may execute a read operation that queries the mapping in DRAM 52 so as to obtain the physical storage locations that correspond to the requested logical addresses. Then, the operation reads the data from these physical storage locations in memory devices 28. A similar flow can be defined for write operations, as well. This technique enables the memory controller to perform logical-physical address translation with minimal internal memory and without having to store the mapping in non-volatile memory devices 28. The read/write speed of system 22 is improved considerably in comparison with storing the mapping in devices 28. The speed improvement is particularly high when performing a large number of random read/write operations.

Storing the logical-physical address mapping in the host memory is particularly advantageous in memory controller applications having limited internal memory, such as in μSD controllers. When using this technique, read and write operations do not involve extra read and write operations in order to determine the appropriate address translation and/or update the translation. As a result, read and write throughput are increased. In addition, the number of write operations and the amount of read disturb are reduced, and therefore the lifetime of the non-volatile memory is extended.

In many cases, the memory cells in devices 28 suffer from interference, for example cross-coupling interference from neighboring memory cells. In some embodiments, memory controller 32 applies an interference cancellation process when reading data from the memory cells. The interference cancellation process typically estimates and corrects the interference in a given group of memory cells based on the storage values or data of other memory cells (usually neighboring memory cells) in devices 28. Example interference cancellation techniques are described in PCT International Publications WO 2007/132453, WO 2007/132457 and WO 2008/026203, cited above.

In some embodiments, memory controller 32 retrieves the data of neighboring memory cells from DRAM 52. The memory controller supports a read operation that reads data from a given group of memory cells from memory devices 28, retrieves neighboring cell data from DRAM 52, and cancels the interference in the read data using the neighboring cell data obtained from DRAM 52. The neighboring cell data may be available in DRAM 52, for example, from the time the neighboring pages were stored. This technique relieves the memory controller from the need to read the neighboring memory cells from memory devices 28. As a result, the overall reading speed of system 22 can be improved.

In some embodiments, memory controller 32 uses the larger size of DRAM 52 in order to write larger amounts of data to memory devices 28 in a sequential manner. For example, the memory controller may support a block copyback operation that copies multiple pages (e.g., an entire erasure block) from a certain source location to a certain destination location in memory devices 28. When executing this command, the memory controller first reads the multiple pages sequentially from the source location and caches them in DRAM 52. Then, the memory controller reads the multiple pages from DRAM 52 and writes them sequentially to the destination location in memory devices 28. By reading and writing multiple pages sequentially instead of copying one page at a time, the duration of the copyback operation is reduced considerably. As another example, DRAM 52 can be used (either by the memory controller or by the host) to accumulate data for storage that arrives intermittently, until a sequential block of data is produced. The memory controller can then write the accumulated block sequentially to memory devices 28.

Additionally or alternatively, memory controller may store in DRAM 52 any other suitable information, and then use this information in accessing memory devices 28. Although the embodiments described herein refer mainly to DRAM resources, memory controller 32 may use any other suitable hardware resource of host system 24. Example resources are described further below.

Figure 2:
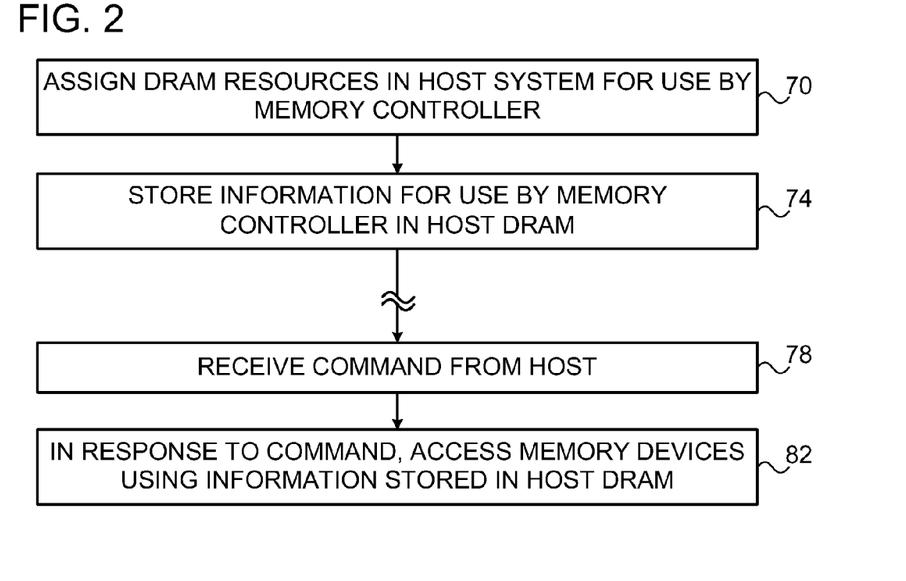
FIG. 2 is a flow chart that schematically illustrates a method for storing data in non-volatile memory using host system resources, in accordance with an embodiment of the present invention.

FIG. 2 is a flow chart that schematically illustrates a method for storing data in non-volatile memory devices 28 by memory controller 32 using DRAM resources of host system 24, in accordance with an embodiment of the present invention. The method begins by assigning storage space in DRAM 52 of host system 24 for use by memory controller 32, at a memory assignment step 70. Memory controller 32 stores in DRAM 52 information items relating to respective groups of analog memory cells of devices 28, at a DRAM storage step 74. As explained above, the information items may comprise storage parameters and configurations, logical-physical address mapping and/or neighboring cell data, for example.

At a certain point in time, memory controller 32 receives a command from host system 24, at a command reception step 78. The command causes the memory controller to access a given group of the analog memory cells of devices 28. For example, the command may request storage or readout of a certain data item. In response to the command, memory controller 32 executes an operation that accesses memory devices 28 using the information retrieved from DRAM 52, at an operation execution step 82. Typically, the memory controller identifies the group of analog memory cells to be accessed in devices 28, retrieves the (one or more) information items pertaining to this memory cell group from DRAM 52, and accesses the memory cells in the group using the retrieved information.

Interfaces Between the Host System and Memory Controller

When carrying out the above-mentioned techniques, memory controller 32 may store and read the information in DRAM 52 using any suitable interface. In the example of FIG. 1 above, the memory controller communicates directly with DRAM 52 using dedicated interface 60 (i.e., using a physical interface that is separate from the physical interface used for communication between the memory controller and the host processor). In these embodiments, retrieving information from DRAM 52 does not involve any operation of the host processor, since the memory controller and DRAM communicate directly. The memory controller and/or host system comprise suitable arbitration logic for controlling access to DRAM 52 by processor 44 and by processor 48.

In alternative embodiments, memory controller 32 stores and reads the information in DRAM 52 using host bus 56 (i.e., over the same physical interface used for communication between the memory controller and the host processor). Host bus 56 may operate in accordance with any suitable standard or protocol, such as, for example, the NAND interface, Micro-SD (μSD) interface, Embedded Multi-Media Card (eMMC) interface, Universal Flash Storage (UFS) interface, Serial Advanced Technology Attachment (SATA) interface, Universal Serial Bus (USB), Peripheral Component Interconnect Express (PCIe), or any other suitable interface.

The μSD interface is specified, for example, in "SD Specifications," Part 1, Physical Layer Specification, Version 3.01 Draft 1.00, Nov. 9, 2009, which is incorporated herein by reference. The eMMC interface is specified, for example, in "Embedded MultiMediaCard (eMMC) Mechanical Standard with Optional Reset Signal," JEDEC Standard JESD84-C44, July, 2009, which is incorporated herein by reference. The UFS interface is specified, for example, in "UFS Specification," version 0.1, Nov. 11, 2009, which is incorporated herein by reference. The SATA interface is specified, for example, in "Serial ATA Revision 3.0," Jun. 2, 2009, which is incorporated herein by reference. The USB interface is specified, for example, in "Universal Serial Bus Specification," Revision 2.0, Apr. 27, 2000, which is incorporated herein by reference.

In the above-listed communication protocols, the host processor is defined as a master and the memory controller is defined as a slave. As such, the memory controller is unable to initiate and send to the host processor commands requesting to store or retrieve information. In some embodiments, memory controller 32 requests host processor 48 to exchange information with DRAM 52, by signaling over a hardware line between the memory controller and the host processor. In some embodiments, a dedicated hardware line may be connected between the memory controller and host processor for this purpose. Alternatively, the memory controller may use an existing hardware line, such as a ready/busy line, for indicating to the host processor that data exchange is requested. Once the host processor receives this indication, it initiates the information exchange process.

Figure 3:
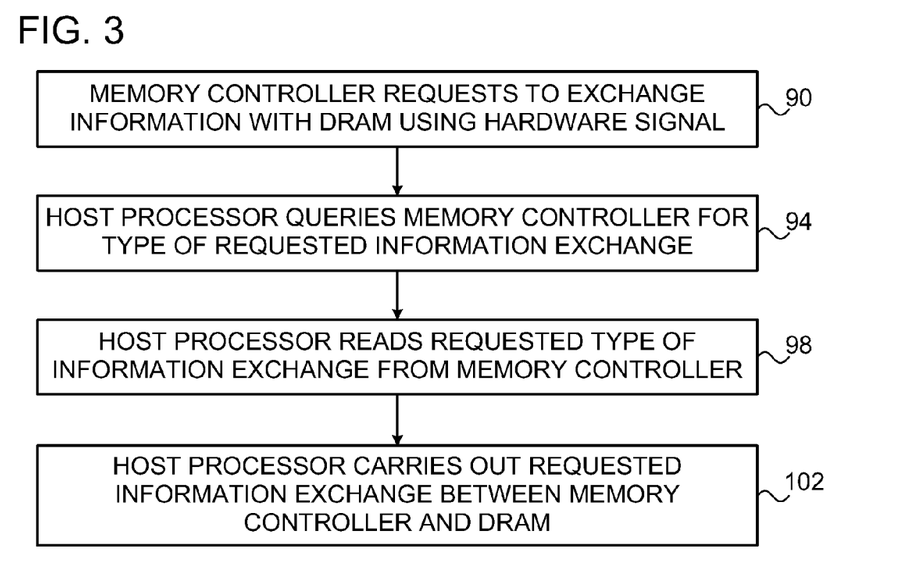
FIG. 3 is a flow chart that schematically illustrates a method for exchanging information between a host processor and a memory controller, in accordance with an embodiment of the present invention.

FIG. 3 is a flow chart that schematically illustrates a method for exchanging information between a host processor and a memory controller, in accordance with an embodiment of the present invention. The method begins with memory controller 32 indicating to host processor 48 that information exchange with DRAM 52 is requested, at an indication step 90. The memory controller signals this indication over a hardware signal (e.g., discrete hardware line or pin) connected between the memory controller and the host processor.

Upon receiving the indication, host processor 48 sends to memory controller 32 a message that queries the type of requested information exchange, at a querying step 94. The querying message requests the memory controller to indicate whether it requests to read information from the DRAM or to store information in the DRAM.

After sending the query message, host processor 48 reads from memory controller 32 data, which indicates the requested type of information exchange, at a readout step 98. For example, the data indicates whether the requested operation reads information from the DRAM or writes information to the DRAM. The data also indicates the range of addresses in DRAM 52 for reading or writing the information. When the request is for storing information in the DRAM, the data also comprises the information to be stored.

Based on the data read from the memory controller at step 98, the host processor carries out the requested information exchange, at an execution step 102. If the memory controller requested to store information in the DRAM, the host processor stores the information at the indicated addresses in the DRAM, and then sends an acknowledgement message to the memory controller. If the memory controller requested to read information from the DRAM, the host processor reads the information from the indicated addresses and sends the information to the memory controller.

In alternative embodiments, the memory controller may exchange information with the DRAM via the host processor using metadata that is included in the host commands and corresponding responses. The memory controller may request information from the DRAM, or send information for storage in the DRAM, by adding metadata to responses sent to the host system (e.g., results of read commands or acknowledgement or write commands). The host processor may send requested information from the DRAM to the memory controller as metadata, which is included in the read or write commands that the host system sends to the memory controller.

In some embodiments, the memory controller and the host processor exchange commands and responses that comprise the applicable DRAM information. For example, when the memory controller reads a certain memory page, it may send the read threshold values used in the read operation to the host processor, together with the read results. In response, the host processor stores the read threshold values in the DRAM. When the host processor sends a read command to the memory controller, it may send the applicable read threshold values (read from the DRAM) to the memory controller as part of the read command.

Although the embodiments described herein mainly address the use of host DRAM, the methods and systems described herein may utilize any other type of host memory, such as Static RAM (SRAM). Additionally or alternatively to assigning and using host memory, the memory controller may use various other resources of the host in order to access the non-volatile memory. For example, the memory controller may use hardware logic circuitry in the host to perform various logical operations (e.g., XOR operations or comparisons) as part of accessing the non-volatile memory. As another example, the memory controller may receive its supply voltage from the host. In such embodiments, the host may provide a stabilized, regulated and/or filtered supply voltage to the memory controller, such that the memory controller can minimize its on-chip regulation, stabilization and/or filtering circuitry. As a result, the power efficiency of the memory controller can be increased and its heat dissipation can be reduced. For example, the memory controller may receive a regulated 1.2V supply voltage from the host, instead of receiving a 1.8V or 3.3V supply voltage and reducing it internally.

As yet another example, the memory controller may invoke the host to perform interference cancellation computations on the data read from the non-volatile memory. In such embodiments, the host may be provided with the read results of one or more pages read from the non-volatile memory, as well as with the read results of neighboring pages. The host may then cancel the interference in the read results based on the read results of the neighboring pages, so as to produce interference-free data.

As still another example, the host can be invoked to perform ECC decoding. In some embodiments, a high-performance ECC decoder (e.g., a soft decoder) can be implemented in the host, using the higher inherent computational complexity of the host, and/or using dedicated hardware. In these embodiments, the memory controller provides the host with code words that are read from the non-volatile memory. The host then decodes the ECC, so as to reconstruct the data. In an example embodiment, the memory controller comprises a certain ECC decoder, and the host comprises another ECC decoder. The decoder in the host is more complex and has a higher error correction capability than the decoder in the memory controller. For example, the decoder in the memory controller may apply hard decoding, whereas the decoder in the host may apply soft decoding. In these embodiments, the memory controller initially attempts to decode a given code word using its local ECC decoder. If the initial attempt fails, the memory controller invokes the higher-performance ECC decoder in the host to decode the code word.

Host-Assisted Block Compaction

In a typical Flash memory, data is written to memory devices 28 in page units, but erasure is applied to entire memory blocks. Data is written only to erased pages, and it is therefore not possible to update data in-place. Updating data involves writing the updated data to another physical storage location in the Flash memory, marking the previous version of the data as invalid, and dynamically updating the logical-to-physical address mapping that translates the logical addresses of the data into the physical storage locations where the data is stored.

Because of the above characteristics, the memory blocks of memory devices 28 gradually accumulate invalid data pages, whose updated versions have been stored in other physical storage locations. In order to reduce the number of invalid pages, processor 44 of memory controller 32 carries out a compaction, or "garbage collection" process. This background process selects one or more memory blocks (referred to as source blocks) for compaction, copies the valid data from the selected source blocks to other storage locations in one or more other blocks (referred to as target blocks), and then erases the source blocks. The erased blocks are then ready for subsequent programming.

Figure 4:
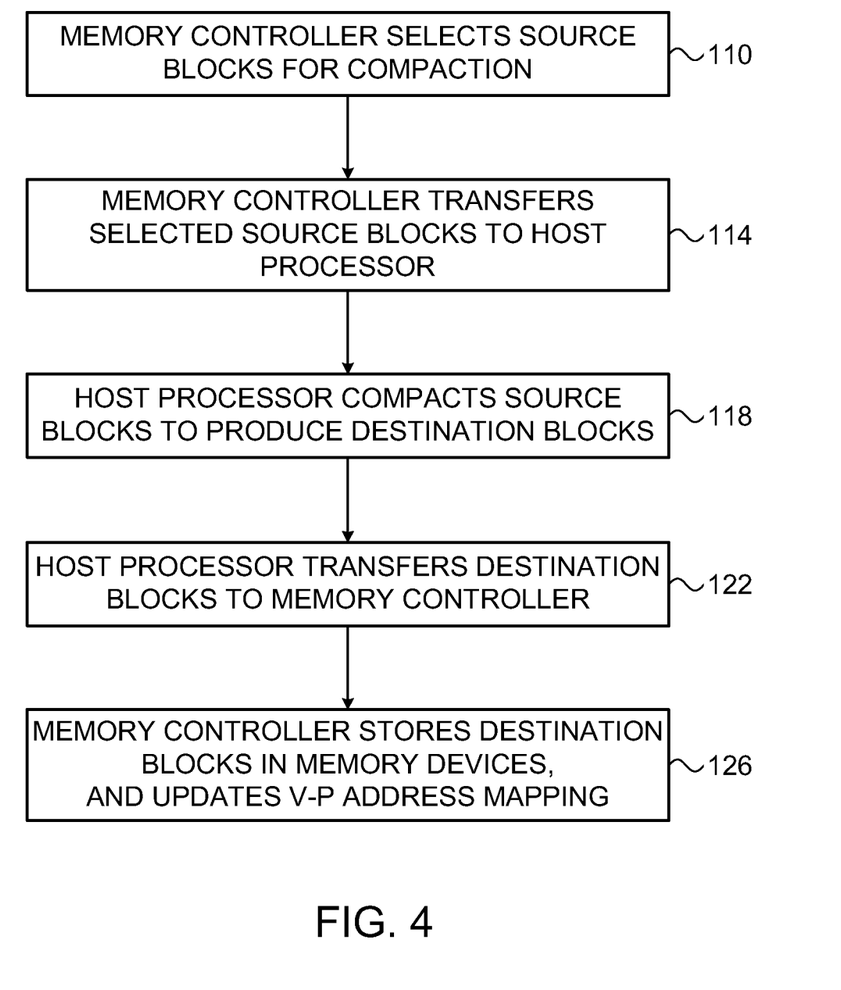
FIG. 4 is a flow chart that schematically illustrates a method for host-assisted block compaction, in accordance with an embodiment of the present invention.

FIG. 4 is a flow chart that schematically illustrates a method for host-assisted block compaction, in accordance with an embodiment of the present invention. The method begins with processor 44 of memory controller 32 selecting one or more source blocks for compaction, at a source block selection step 110. Each source block typically comprises both valid data and invalid data. The memory controller may select the source blocks using any suitable criterion, for example it may select the blocks having the highest amount of invalid data.

Processor 44 transfers the selected source blocks to host system 44, at a source transfer step 114. Processor may transfer the source blocks using any of the interfaces and transfer schemes described above, e.g., to host processor 48 using host bus 56, or directly to DRAM 52 using dedicated interface 60.

In some embodiments, processor 44 also sends to the host indications that identify the valid data, so that the host is able to read only the valid data from the source blocks based on the indications. Any suitable type of indications may be sent, either as part of the source blocks or separately, and the indications may be sent to the host using any suitable interface. In alternative embodiments, the memory controller transfers only the valid data from the source blocks, and not the entire source blocks, to the host. In the context of the present patent application and in the claims, transferring only the valid data is also regarded as transferring the source blocks for compaction.

Host processor 48 compacts the source blocks, at a compaction step 118. The host processor typically copies the valid data from the source blocks and stores it in one or more destination blocks sequentially. As a result, the valid data is stored in the destination blocks in a compact manner while eliminating regions of invalid data. The destination blocks are stored in DRAM 52.

The destination blocks are transferred from host system 24 to memory controller 32, at a destination transfer step 122. Transfer of the destination blocks may be carried out using any of the interfaces and transfer schemes described above, e.g., from host processor 48 using host bus 56, or directly from DRAM 52 using dedicated interface 60.

Processor 44 of memory controller 32 stores the destination blocks in memory devices 28, at a storage step 126. Additionally, processor 44 updates the logical-to-physical address mapping to indicate the new physical storage locations of the valid data. After the compaction process is completed, processor 44 typically erases the source blocks. These blocks are then available for new programming.

Since DRAM 52 of the host is typically much larger than the internal memory of memory controller 32, performing compaction by the host is considerably more efficient than by the memory controller. For example, because of the large memory space, host processor 48 is able to copy the valid data by performing long sequences of read operations (from the source blocks) followed by long sequences of write operations (into the destination blocks). This sort of sequential operation improves the efficiency of the compaction process significantly.

The large memory space in DRAM 52 enables host processor 48 to handle a large number of source and destination blocks simultaneously, and thus optimize the compaction performance. Moreover, the high computational power of the host processor reduces the latency of the compaction process.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

The invention claimed is:

1. A method for data storage, comprising:
   in a system that includes a host and a memory controller that is separate from the host and stores data for the host in a non-volatile memory, allocating a portion of a host memory for use by the memory controller;
   sending, by the memory controller, a signal to the host to exchange information;
   sending, by the host, a query message to the memory controller responsive to the signal;
   sending, by the memory controller, a response to the query message, wherein the response to the query message includes a request to retrieve information items relating to one or more source blocks of the non-volatile memory from the portion of the host memory, and a range of addresses indicating one or more storage locations in the host memory from which to retrieve the information items;
   retrieving, by the host, from the portion of the host memory the information items dependent upon the range of addresses;
   sending, by the host, the information items to the memory controller;
   reading, by the memory controller, the one or more source blocks from the non-volatile memory dependent upon the information items;
   transferring from the memory controller to the host the one or more source blocks;
   compacting the one or more source blocks in the host by copying valid data from the one or more source blocks into one or more destination blocks;
   transferring the one or more destination blocks from the host to the memory controller; and storing the one or more destination blocks by the memory controller in the non-volatile memory.

2. The method according to claim 1, wherein transferring the one or more source blocks comprises storing the one or more source blocks in host memory, and wherein compacting the one or more source blocks comprises producing the one or more destination blocks using a processor of the host and storing the destination blocks in the host memory.

3. The method according to claim 1, wherein copying the valid data comprises performing a first sequence of read operations from the one or more source blocks, and then performing a second sequence of write operations to the one or more destination blocks.

4. The method according to claim 1, wherein the information items comprise a logical-to-physical address mapping, and wherein storing the destination blocks comprises updating the logical-to-physical address mapping to indicate respective physical storage locations of the destination blocks in the non-volatile memory.

5. The method according to claim 1, wherein transferring the one or more source blocks comprises sending to the host indications that identify the valid data, and wherein compacting the one or more source blocks comprises reading the valid data from the one or more source blocks based on the indications.

6. The method according to claim 1, wherein transferring the one or more source blocks comprises sending to the host only the valid data from the source blocks.

7. The method according to claim 1, wherein transferring the one or more source blocks and the one or more destination blocks comprises sending the one or more source blocks and the one or more destination blocks over a first physical interface that is separate from a second physical interface used for exchanging memory access commands between the memory controller and the host.

8. The method according to claim 1, wherein transferring the one or more source blocks and the one or more destination blocks comprises sending the one or more source blocks and fetching the one or more destination blocks by the memory controller without execution of any operations by the host relating to transfer of the one or more source blocks and the one or more destination blocks.

9. The method according to claim 1, wherein transferring the one or more source blocks and the one or more destination blocks comprises sending the one or more source blocks and the one or more destination blocks over a common physical interface that is also used for exchanging memory access commands between the memory controller and the host.

10. The method according to claim 9, wherein the common physical interface conforms to one of a NAND interface specification, a Micro-SD (μSD) interface specification, an Embedded Multi-Media Card (eMMC) interface specification, a Universal Flash Storage (UFS) interface specification, a Serial Advanced Technology Attachment (SATA) interface specification, a Universal Serial Bus (USB) interface specification and a Peripheral Component Interconnect (PCI) interface.

11. The method according to claim 1, wherein transferring the one or more source blocks and the one or more destination blocks comprises:
using a hardware signal, sending a request from the memory controller to the host to exchange information with the memory controller; and
responsively to the request, initiating exchange of at least one of the one or more source blocks or at least one of the one or more destination blocks by the host.

12. The method according to claim 1, wherein transferring the one or more source blocks comprises sending the one or more source blocks in responses sent from the memory controller to the host, and wherein transferring the one or more destination blocks comprises sending the one or more destination blocks in one or more host commands sent from the host to the memory controller.

13. A data storage apparatus, comprising:
a first interface, which is configured to communicate with a non-volatile memory;
a second interface, which is configured to communicate with a host; and
a processor configured to:
send a signal to the host to exchange information;
receive a query message from the host responsive to sending the signal;
send a response to the query message, wherein the response to the query message includes a request to the host to retrieve, from a host memory, information items relating to one or more source blocks stored in the non-volatile memory, and a range of addresses indicating one or more storage locations in the host memory from which to retrieve the information items;
receive the information items from the host;
read the one or more source blocks from the non-volatile memory dependent upon the information items;
transfer to the host the one or more source blocks to the host;
receive from the host one or more destination blocks that were produced in the host by copying valid data from the one or more source blocks into the one or more destination blocks; and
store the one or more destination blocks in the non-volatile memory.

14. The apparatus according to claim 13, wherein the information items comprise a logical-to-physical address mapping, and wherein the processor is further configured to update the logical-to-physical address mapping to indicate respective physical storage locations of the destination blocks in the non-volatile memory.

15. The apparatus according to claim 13, wherein the processor is further configured to copy the valid data by performing a first sequence of read operations from the one or more source blocks, and then performing a second sequence of write operations to the one or more destination blocks.

16. The apparatus according to claim 13, wherein the processor is further configured to send to the host indications that identify the valid data, so as to enable the host to read the valid data from the one or more source blocks based on the indications.

17. The apparatus according to claim 13, wherein the processor is further configured to send to the host only the valid data from the one or more source blocks.

18. The apparatus according to claim 13, wherein the processor is further configured to transfer the one or more source blocks and the destination blocks over a first physical interface that is separate from a second physical interface used for exchanging memory access with the host.

19. The apparatus according to claim 13, wherein the processor is further configured to send the one or more source blocks and fetch the destination blocks without execution of any operations by the host relating to transfer of the one or more source blocks and the one or more destination blocks.

20. The apparatus according to claim 13, wherein the processor is further configured to transfer the one or more source blocks and the one or more destination blocks over a common physical interface that is also used for exchanging memory access commands between the processor and the host.

21. The apparatus according to claim 20, wherein the common physical interface conforms to one of a NAND interface specification, a Micro-SD (μSD) interface specification, an Embedded Multi-Media Card (eMMC) interface specification, a Universal Flash Storage (UFS) interface specification, a Serial Advanced Technology Attachment (SATA) interface specification, a Universal Serial Bus (USB) interface specification and a Peripheral Component Interconnect (PCI) interface.

22. The apparatus according to claim 13, wherein to transfer the source blocks and the destination blocks, the processor is further configured to:
    using a hardware signal, send a request to the host to exchange information with the processor; and
    responsive to the request, initiate exchange of at least one source block of the one or more source blocks or at least one destination block of the one or more destination blocks by the host.

23. The apparatus according to claim 13, wherein the processor is further configured to send the one or more source blocks in responses sent to the host, and to receive the one or more destination blocks in one or more host commands sent from the host.

24. A system, comprising:
    a non-volatile memory, comprising a plurality of memory blocks;
    a host coupled to a host memory; and
    a memory controller configured to:
        select, for compaction, one or more source blocks from the plurality of memory blocks;
        send a signal to the host to exchange information;
        receive a query message from the host responsive to sending the signal; and
        send a response to the query message to the host, wherein the response to the query message includes a request to the host to retrieve information items relating to the one or more source blocks of the non-volatile memory from the host memory, and a range of addresses indicating one or more storage locations in the host memory from which to retrieve the information items;
    wherein the host is configured to:
        retrieve the information items from the host memory dependent upon the range of addresses; and
        send the information items to the memory controller;
    wherein the memory controller is further configured to:
        read the one or more source blocks from the non-volatile memory dependent upon the information items; and
        transfer the one or more source blocks to the host;
    wherein the host is further configured to:
        receive the one or more source blocks; and
        compact the source blocks by copying valid data from the one or more source blocks into one or more destination blocks; and
    wherein the memory controller is further configured to:
        receive the one or more destination blocks from the host; and
        store the one or more destination blocks in the non-volatile memory.

25. The system according to claim 24, wherein the host is configured to copy the valid data by performing a first sequence of read operations from the one or more source blocks, and then performing a second sequence of write operations to the one or more destination blocks.

* * * * *